(12) United States Patent
Jorgensen et al.

(10) Patent No.: US 9,413,358 B2
(45) Date of Patent: Aug. 9, 2016

(54) FORWARD COUNTER BLOCK

(75) Inventors: Steven Glen Jorgensen, Newcastle, CA (US); Mark Allen Gravel, Roseville, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 824 days.

(21) Appl. No.: 13/459,199

(22) Filed: Apr. 29, 2012

(65) Prior Publication Data
US 2013/0290649 A1   Oct. 31, 2013

(51) Int. Cl.
*G06F 12/00* (2006.01)
*G06F 13/00* (2006.01)
*G06F 13/28* (2006.01)
*H03K 21/38* (2006.01)
*G06F 12/08* (2016.01)

(52) U.S. Cl.
CPC ........... *H03K 21/38* (2013.01); *G06F 12/08* (2013.01); *G06F 12/0804* (2013.01); *G06F 2212/1016* (2013.01)

(58) Field of Classification Search
CPC ... G06F 12/08; G06F 9/5016; G06F 12/0804; G06F 2201/88
USPC .................................................. 711/154, 155
See application file for complete search history.

(56) References Cited

U.S. PATENT DOCUMENTS

| | | | |
|---|---|---|---|
| 7,086,025 B1 | 8/2006 | Yang | |
| 7,549,036 B2 | 6/2009 | Mehta et al. | |
| 7,979,983 B2 | 7/2011 | Bird et al. | |
| 2002/0016935 A1* | 2/2002 | Bergsten et al. | 714/20 |
| 2003/0037190 A1* | 2/2003 | Alexander et al. | 710/52 |
| 2006/0107158 A1* | 5/2006 | Mishra et al. | 714/741 |
| 2006/0265526 A1* | 11/2006 | Holbrook | 710/52 |
| 2011/0029813 A1 | 2/2011 | Gunderson et al. | |
| 2011/0063931 A1 | 3/2011 | Linam et al. | |
| 2012/0159502 A1* | 6/2012 | Levin et al. | 718/104 |

* cited by examiner

*Primary Examiner* — Charles Rones
*Assistant Examiner* — Sidney Li
(74) *Attorney, Agent, or Firm* — Pearl Cohen Zedek Latzer LLP

(57) ABSTRACT

A forward counter block may include at least one of a plurality of local counter storage elements for counting events. The forward counter block may also include an update engine, the update engine configured to update an external memory by forwarding a value stored in any of said at lease one of a plurality of local counter storage elements and return a zero value to that local counter storage element, when the value stored in that local counter storage element reaches or surpasses a threshold value.

14 Claims, 2 Drawing Sheets

FORWARD COUNTER BLOCK

BACKGROUND

A counter is a memory-type device, which counts events, by storing a single natural number. Counters may be associated with a finite-state machine (FSM) which may perform any of the following operations on the counter: check whether the value stored in the counter is zero; increment the counter by one; and decrement the counter by one (if zero already the value on the counter remains unchanged).

In an application specific integrated circuit (ASIC) the number of events associated with a single counter in a time frame of interest to humans (greater than one second) may make it prohibitive to implement the full counter read by humans in the ASIC, if there are a large number of counters. This is because of the cost of resources needed to implement the counters with in the ASIC. This issue is resolved by using a smaller counter and implementing software to poll the counters to update a much larger counter in CPU memory which is less costly.

Reading and updating these counters consumes a noticeable portion of a single CPU bandwidth.

Typically an update action that updates an upper layer software with the current value stored by the counter, is performed at a predetermined timing scheme, and includes a series of steps: 1) the currently stored value of the counter is read by the software; 2) The software refers to the latest value in the memory of the software for that counter; 3) the difference between latest value in the memory of the software and the currently stored value of the counter is calculated; 4) the value stored in the counter is updated; and 5) the value in the memory of the software is updated.

BRIEF DESCRIPTION OF THE DRAWINGS

Examples are described in the following detailed description and illustrated in the accompanying drawings in which.

DETAILED DESCRIPTION

Figure 1:
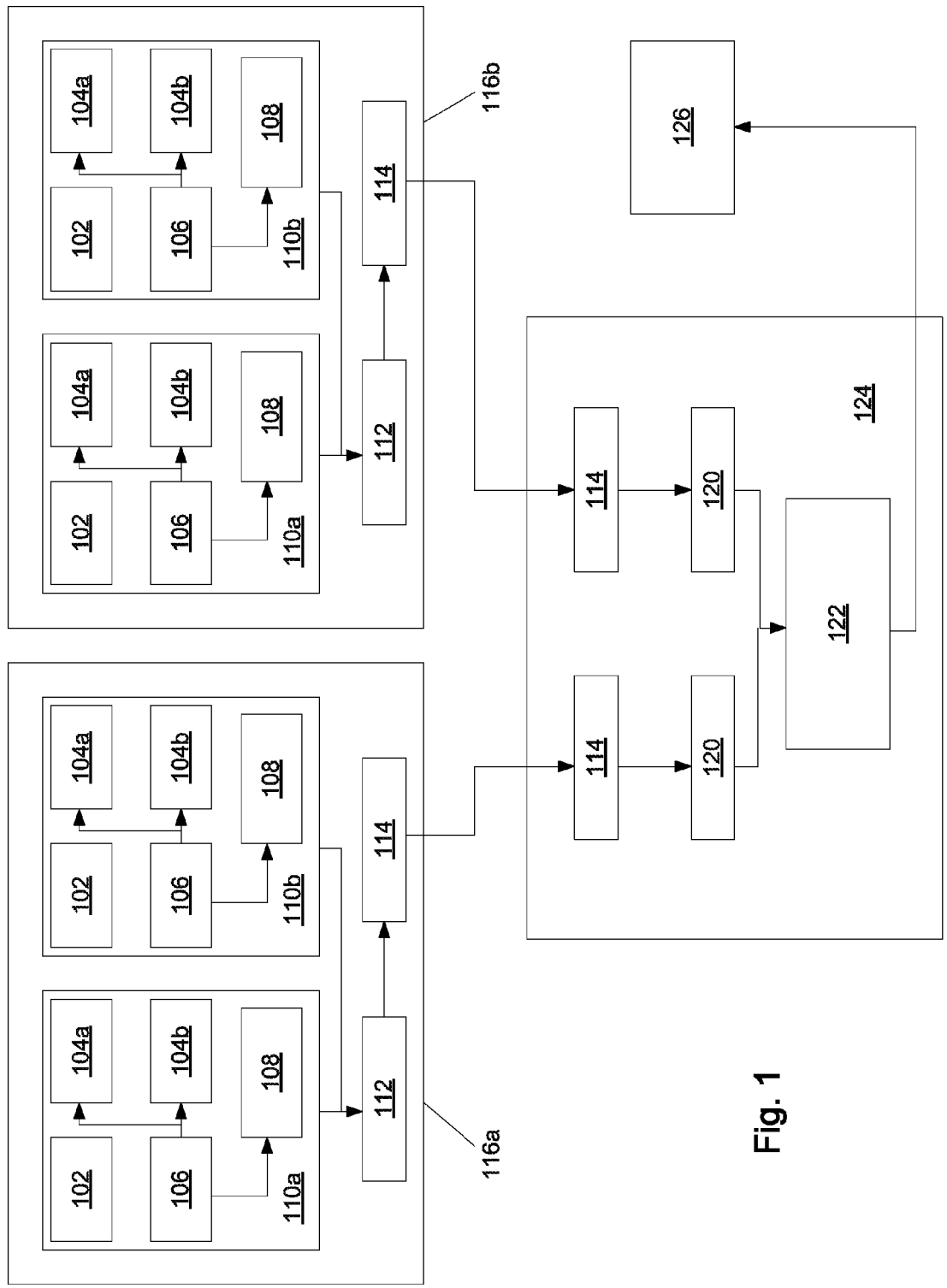
FIG. 1 illustrates a counter system, in accordance with an example.

In the following detailed description, numerous specific details are set forth. However, it will be understood by those skilled in the art that examples may be practiced without these specific details. In other instances, well-known methods, procedures, and components have not been described in detail so as not to obscure the discussed examples.

Although examples are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

Unless specifically stated otherwise, as apparent from the following discussions, it is appreciated that throughout the specification, discussions utilizing terms such as "adding", "associating" "selecting," "evaluating," "processing," "computing," "calculating," "determining," "designating," "allocating" or the like, refer to the actions and/or processes of a computer, computer processor or computing system, or similar electronic computing device, that manipulate, execute and/or transform data represented as physical, such as electronic, quantities within the computing system's registers and/or memories into other data similarly represented as physical quantities within the computing system's memories, registers or other such information storage, transmission or display devices.

Counters which are included in an ASIC take up a considerable part of the die area. The die area is a function of the total number of counter implemented in an AISC and the planned polling rate of the software that uses the counters such that the counter cannot roll in that period of time—the counter cannot transit from its maximum value to its minimum value. More specifically since a counter roll can be calculated for, it means that the counter cannot reach the value it was read at during the last polling sample. For a counter that can count to 100 and wraps to 0 after reaching 100, the polling device cannot tell if 1 event or 101 events took place.

Furthermore, counters which are included in an ASIC take their toll in the CPU's main memory (e.g. Double Data Rate DRAM (DDR DRAM)) bandwidth and capacity. This is because the software polls each of the counters to determine whether their stored values have changed. This creates two copies of the counter in the CPU Memory, both of which need a "Read Modify Write" transaction on each counter update.

Counter polling may be one of the heaviest users of the CPU internal bus, which typically does not match up to the performance of CPU Main Memory. Additionally, each counter will need to be checked regardless of whether an event has occurred or not In accordance with examples a novel counter architecture is introduced which allows ASIC counters to take up less die area and reduces the number of access instances required by the software to maintain larger counters in DDR.

FIG. 1 illustrates a forwarding counter system 100, in accordance with an example.

The following glossary is used with relation to FIG. 1:

102: FIFO for smoothing out requests to the ALU;

104a, 104b: Local counter storage elements. May be, for example, RAM or Flops;

106: Local ALU engine: responsible for maintaining the counter storage element associated with it (e.g. 104a, 104b). This includes processing updates (incoming events) and flushing the counters. It also passes data to 112;

108: Counter DMA update storage: typically a single deep FIFO, but may include a plurality of deep FIFOs. It is used for storing remote counter updates. This block arbitrates for Counter DMA Update FIFO 112 and indicates to the Local ALU Engine 106 if it has room for an update;

110a, 110b, 110c, 110d: Counter blocks;

112: Counter DMA Update FIFO: This FIFO is used for consolidating all of the updates from all of the counter blocks 110a, 110b, 110c, 110d in the corresponding top-level module 116a (and 116b, 116c and 116d, respectively) and for packaging the data up for transmission to the external memory interface module 124 through the internal interface module 114;

114: Internal interface module;

116a, 116b: Top-level module: An arbitrary segmentation of functionality within an ASIC to assist in the physical implementation;

120: CPU/External memory interface: Responsible for maintaining counters in external memory. This may include processing updates from the internal interface module and arbitrating for the external memory controller 122;

122: External memory controller: arbitrates among all requestors including the external memory interface 120 and performs the appropriate protocol to service the request.

124: External memory interface module: Top-level module containing the external memory controller 122;

126: External Memory (e.g., DDR, SRAM, etc).

Forwarding counter system 100 may include counter blocks 110a, 110b, 110c, 110d (FIG. 1 shows only four counter blocks for brevity) arranged in top level modules 116a and 116b. The number of counter blocks may vary and would typically be much greater) depending on the number of events that need accounting, the planned bandwidth and performance requirements.

Each counter block 110a, 110b, 110c, 110d, has a number of local counter storage elements 104a, 104b, (e.g. counter RAM—random access memory, static random access memory—SRAM, or flops), each with its own update engine, which includes local arithmetic logic unit (ALU) engine 106 and Counter DMA update storage element 108. The local ALU engine 106 performs the Read Modify write operation to the local counter storage elements 104a, 104b. If the local ALU engine 106 detects that the local counter storage element (e.g. 104a, 104b) needs a DMA update it will post that to the counter DMA update engine 108 and write 0 back to the counter storage (an operation which is sometimes called "flushing").

Each local counter storage element (104a, 104b) is used to count events. Each Counter Block (110a, 110b, 110c, 110d) in the system has a unique ID associated with it.

When the local ALU engine 106 performs a "read modify write" action on any of the local counter storage elements (104a, 104b), if it detects that the local counter storage element being updated is about to warp after it has been modified (may be determined by looking at the most-significant bits (MSBs)), the local ALU engine 106 attempts to forward the modified value of that local counter storage element and its offset into the dedicated counter DMA update storage 108 (Flops, Rams, Etc) of that counter block. If space in the counter DMA update storage 108 is available, the engine writes 0 back to the local counter storage element 104a, 104b (e.g. SRAM) and writes modified value to the counter DMA update Storage (108), if the storage is full it will write the modified value back to the local counter storage element (SRAM) 104a, 104b and would attempt again when the next transaction to that local counter storage element occurs. The counter DMA update storage 108 will arbitrate with all of the counter blocks 110a, 110b (or 110c, 110d respectively) locally, for access to a counter DMA update FIFO 112 that feeds an internal interface Module 114 to the counter update engine associated with the CPU/External Memory interface 120, that is located in External Memory Interface 124. The Internal interface module 114 Transmits the data to the External Memory Interface module 124. Data forwarded to the external memory interface module 124 may include, for example: 2 bits ALU Operation Type; 6 Reserved Bits; 8 bits of Counter ID; 16 bits of Counter Offset; 24 bits Upper Counter Data; 24 bits Lower Counter Data. The fact that there are two local counter storage elements in play per update is an optimization because DRAMs want to burst large amounts of data. Particularly since the performance of the system is dependent on the locality of grouped local counter storage elements.

At the external memory interface module 124 each internal interface module 114 may either have a dedicated CPU/External memory interface 120 or arbitrate for access to a shared set of DDR Counter Update Engines (not shown in this figure). CPU/External memory interface 120 takes information from the FIFO as well as information associated with the Counter ID, such as the base address for the counter block, and read modify write two 64 bit counters in the DDR.

Each of the counter ID table entries (typically 256, the actual size is bound by the data structure used between the counter blocks 110a, 110b, 110c, 110d, and the external memory interface module 124) may contain at least: base DDR Address for this bank of counters (typically up to a 128 bit boundary); a shift value for the Offset (typically set to at least 4, or any other number of counters that are modified in a single external memory transaction); a size value of the counter block to prevent overwriting non-allocated memory space.

In accordance with some examples, Data flow between FIFO 114 and the CPU/External memory interface 120 is pipelined such that data from one update can Transferred in from a counter block while another update is waiting on the CPU/External memory interface 120. Also, in some examples, the CPU/External memory interface 120 is designed to have an arbitrary native data size (e.g. 128 bits) to allow different ALU operations such as a Logical OR In support of age bit updates. This would allow a single large Logical operation or multiple, in this case two arithmetic operations Because the system is event driven, the total number of events for a single transaction has a major impact on the size of the counters. The assumption for this design is that if there is locality (a plurality of local counter storage elements being updated at the same time), for a given event that both of those local counter storage elements are next to each in both the SRAM and the DDR. For example, Ethernet counters count both Packets and Octets at the same time. This allows for less updates to the DDR and for a larger burst size for each update.

Times of low traffic may cause the value stored in a local counter storage element to remain below the threshold, and thus prevent the external memory from being updated for a lengthy period of time. To handle the counters in such times of low traffic, software may be designed to initiate forced flushing of local counter storage elements 104a, 104b when a predetermined period of time has passed since the previous flush and dump them to CPU/External memory interface 120. For this aim, each counter block 110a, 110b, 110c, 110d has a state machine that inserts flush operations in between counter updates, which is initiated by a register write by the software. The state machine scans every local counter storage element (104a,104b) and if the value stored has been updated (i.e. non-zero) transfers non-zero counter values to the counter DMA update storage 108 register if it is available. If the counter DMA update storage 108 register is not available it will have to re-try that address. To optimize the flush operations, the Counter Block (110a, 110b, 110c, 110d) may maintain a set of "dirty" bits, where each bit represents a segment of the counter space. The dirty bits may also be used to inform upper layers of SW regarding what counters have been updated. In accordance with some examples, there will be between 8 and 32 dirty bits depending on the number of counters in the counter block. When any counter is updated the dirty bit for that segment is set. When the counters are flushed, the dirty bits are latched, and the internal bits are cleared to be set by counter updates during the flush period. The latched bits are presented to the register read interface and are used by the flush state machine to determine which segments to flush and are presented to SW to indicate which counters have been updated. The flush state machine provides a CPU accessible register to indicate that the flush operation is complete.

To prevent the flush operation from overriding the counter update operations, the flush state machine is configured to stall if the counter DMA update FIFO 112 reaches an almost full threshold. This threshold may be adjustable to allow optimization between flush operations and counter update operations. In some examples, there is a very slim probability that the interface flops are not available each time a counter updates past the threshold, and that the counter wraps before it can be cleared. In this case the counter block is configured to generate an interrupt and latch the update and offset writing the old value back to the SRAM local counter storage elements (104*a*, 104*b*). In counter blocks (110*a*, 110*b*, 110*c*, 110*d*) with many (e.g. more than four) update engines, a high priority set of counter update storage similar to 108 could be maintained for counters past an additional threshold for example the 2 MSB bits set that cannot update their dedicated interface storage. This additional storage would have higher priority access to the Counter Update FIFO.

To support the implementation of aging bits and to reduce the requirement for CPU accesses into the ASIC registers space, a module similar to the counter block could be implemented to create a set of aging bits in DDR.

Figure 2:
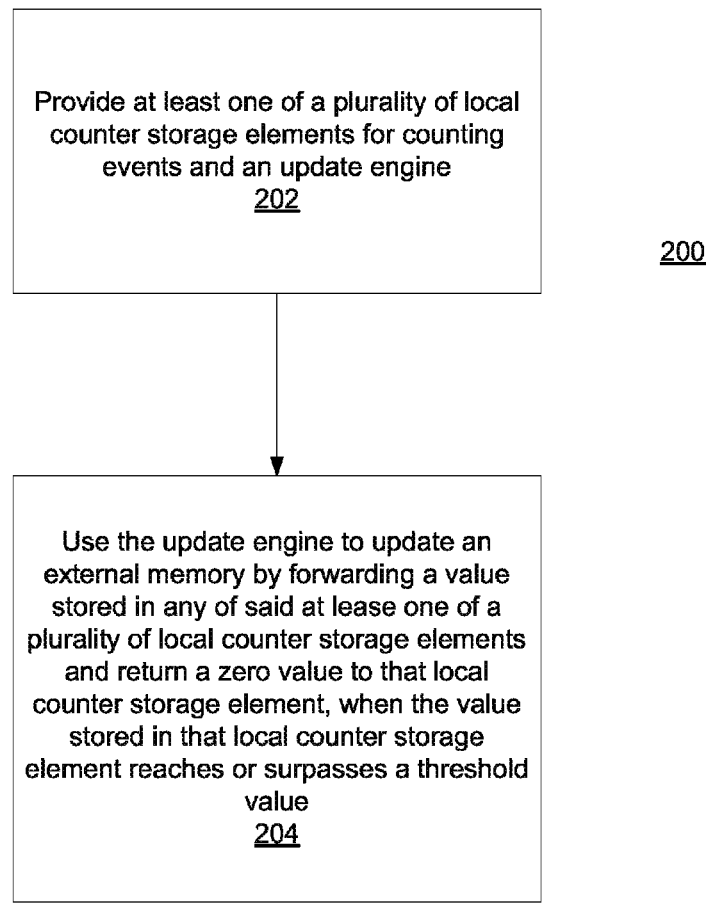
FIG. 2 illustrates a flow diagram of a process for even counting in accordance with an example.

FIG. 2 illustrates a flow diagram of a process 200 for event counting in accordance with an example. Process 200 may include providing 202 at least one of a plurality of local counter storage elements for counting events and an update engine. Process 200 may also include using 204 the update engine to update an external memory by forwarding a value stored in any of said at lease one of a plurality of local counter storage elements and return a zero value to that local counter storage element, when the value stored in that local counter storage element reaches or surpasses a threshold value.

Examples may be embodied in the form of a system, a method or a computer program product. Similarly, examples may be embodied as hardware, software or a combination of both. Examples may be embodied as a computer program product saved on one or more non-transitory computer readable medium (or mediums) in the form of computer readable program code embodied thereon. Such non-transitory computer readable medium may include instructions that when executed cause a processor to execute method steps in accordance with examples. In some examples the instructions stores on the computer readable medium may be in the form of an installed application and in the form of an installation package.

Such instructions may be for example loaded into one or more processors and executed.

For example, the computer readable medium may be a non-transitory computer readable storage medium. A non-transitory computer readable storage medium may be, for example, an electronic, optical, magnetic, electromagnetic, infrared, or semiconductor system, apparatus, or device, or any combination thereof.

Computer program code may be written in any suitable programming language. The program code may execute on a single computer, or on a plurality of computers.

Examples are described hereinabove with reference to flowcharts and/or block diagrams depicting methods, systems and computer program products according to examples.

What is claimed is:

1. A forward counter block comprising:
a local counter storage element for counting events;
an update storage;
an update engine, the update engine to update an external memory by forwarding a modified value stored in the local counter storage element to the external memory via the update storage, wherein the update engine is, upon detection that the local counter storage element reaches or surpasses a threshold value, to forward the modified value of the local counter storage element to the update storage and return a zero value to the local counter storage element,
wherein, to forward the modified value stored in the local counter storage element to the external memory, the update engine is to:
determine whether the update storage has available space,
in response to a determination that the update storage has available space, forward the modified value of the local counter storage element to the update storage, and
in response to a determination that the update storage does not have available space, write the modified value back to the local counter storage element, and repeat the forwarding of the modified value of the local counter storage element to the update storage in a next transaction that occurs at the local counter storage element; and
a state machine to insert a flush operation between counter updates, including initiate the update engine to force flush the modified value stored in the local counter storage element and update the external memory during the flush operation.

2. The counter block of claim 1, wherein the update engine includes an arithmetic logic unit.

3. The counter block of claim 1, wherein the update storage is to arbitrate with other counter blocks to insert the modified value into a counter update FIFO that transmits the modified value to the external memory.

4. The counter block of claim 1, wherein software initiates the forced flush.

5. The counter block of claim 1, further comprising a counter update engine associated with a CPU/External Memory interface.

6. A forward counter system comprising:
a plurality of forward counter blocks; and
a counter update FIFO to receive an output from each of the plurality of forward counter blocks and forward the output to an external memory,
wherein each of the plurality of forward counter blocks includes a local counter storage element for counting events, an update storage connected to the counter update FIFO, and an update engine,
wherein the update engine is, upon detection that the local counter storage element reaches or surpasses a threshold value, to forward a modified value of the local counter storage element to the update storage and return a zero value to the local counter storage element, and
wherein the update engine is to:
determine whether the update storage has available space,
in response to a determination that the update storage has available space, forward the modified value stored in the local counter storage element to the update storage, and
in response to a determination that the update storage does not have available space, write the modified value back to the local counter storage element, and repeat the forwarding of the modified value of the local counter storage element to the update storage in a next transaction that occurs at the local counter storage element; and
a state machine to insert a flush operation between counter updates, including initiate the update engine to force flush the modified value stored at the local counter storage element and update the external memory during the flush operation.

7. The system of claim 6, wherein the update engine includes an arithmetic logic unit.

8. The system of claim 6, wherein the update storage of each of the plurality of forward counter blocks is to arbitrate with other forward counter blocks to insert the modified value into the counter update FIFO.

9. The system of claim 6, wherein software initiates the forced flush.

10. The system of claim 6, wherein the counter update FIFO is associated with a CPU/External Memory interface.

11. The system of claim 10, wherein the counter update FIFO comprises a DDR counter update.

12. A method for updating an external memory with a value stored in a local counter storage element of a counter block, wherein the counter block includes the local counter storage element, an update storage, and an update engine, the method comprising:
   detecting, by the update engine, a modified value stored in the local counter storage element;
   upon detecting that the local counter storage element reaches or surpasses a threshold value, forwarding, by the update engine, a modified value of the local counter storage element to the update storage and returning a zero value to the local counter storage element;
   determining, by the update engine, whether the update storage has available space;
   forwarding, by the update engine, the modified value of the local counter storage element to the update storage in response to a determination that the update storage has available space;
   writing the modified value back to the local counter storage element in response to a determination that the update storage does not have available space;
   repeating the forwarding of the modified value of the local counter storage element to the update storage in a next transaction that occurs at the local counter storage element; and
   inserting a flush operation between counter updates, including force flushing the modified value stored at the local counter storage element and updating the external memory during the flush operation.

13. The method of claim 12, further comprising:
   arbitrating, by the update storage, with other counter blocks to insert the modified value into a counter update FIFO; and
   transmitting the modified value from the counter update FIFO to the external memory.

14. The method of claim 12, further comprising:
   maintaining a dirty bit representing a condition of the local counter storage element;
   when the local counter storage element is updated with the modified value, setting the dirty bit to a value indicating that the local counter storage has been updated; and
   when the local counter storage element is flushed, latching the set value of the dirty bit such that the dirty bit is cleared to be set during a next flush period.

* * * * *